United States Patent [19]

Azoz et al.

[11] Patent Number: 5,167,888
[45] Date of Patent: Dec. 1, 1992

[54] POLYMER COMPOSITES

[75] Inventors: Nazar E. N. Azoz, East Sussex; Munteser M. Kadim, West Sussex, both of England

[73] Assignee: The British Petroleum Company p.l.c., London, England

[21] Appl. No.: 617,565

[22] Filed: Nov. 26, 1990

[30] Foreign Application Priority Data

Nov. 30, 1989 [GB] United Kingdom ............... 8927085
Apr. 19, 1990 [GB] United Kingdom ............... 9008839

[51] Int. Cl.⁵ .................. C30B 13/08; C30B 28/08
[52] U.S. Cl. .................................... 264/108; 264/235; 264/237; 264/346; 264/348; 528/481; 528/503
[58] Field of Search ............... 264/235, 237, 346, 348, 264/108; 528/481, 503

[56] References Cited

U.S. PATENT DOCUMENTS

| | | | |
|---|---|---|---|
| 3,360,406 | 12/1987 | Sumski | 148/1.6 |
| 4,311,660 | 1/1982 | Barkham et al. | 528/503 |
| 4,407,879 | 10/1983 | Smart | 264/348 |
| 4,415,523 | 11/1983 | Barkham et al. | 528/503 |
| 4,692,285 | 9/1987 | Bloomfield et al. | 264/348 |
| 4,738,811 | 4/1988 | Hara et al. | 264/237 |
| 4,806,579 | 2/1989 | Calvert et al. | 524/216 |
| 4,808,353 | 2/1989 | Nambu et al. | 264/237 |
| 4,812,274 | 3/1989 | Labaig et al. | 264/235 |
| 4,839,129 | 6/1989 | Mizuno et al. | 264/235 |

FOREIGN PATENT DOCUMENTS

0232138 8/1987 European Pat. Off.
2090465 7/1982 United Kingdom.

OTHER PUBLICATIONS

Temperature Gradient Zone Melting-V. N. Lozovskii; V. P. Popov Prog. Crystal Growth Charact. 1983, vol. 6, pp. 1–23.
Optical and Nonlinear Optical Characterization of Molecularly Doped Thermotropic Liquid Crystalline Polymers—G. R. Meredith, J. G. VanDusen & D. J. Williams—Macromolecules 1982 pp. 1385–1389.
Zone Melting of Organic Compounds—Herington, E. F. G., Blackwell Scientific Publications—Oxford, 1963; pp. 27, 28.
Zone Melting—Hermann Schildnecht; Verlag Chemie Meinheim 1966 pp. "Equipment" & 80–85.
A Technique for Growth of Alkali Halide Crystals in Stationary Crucible—S. C. Sabharwal T. Mirza, S. C. Karandikar & B. Ghosh; Journal of Crystal Growth 1987; pp. 32–37.
Melt Growth-D. T. J. Hurle; 1973—pp. 210–247 Crystal growth: an introduction.
Crystal Growth of GaAs from Ga by a Traveling Solvent Method—A. I. Mlavsky & Martin Weinstein; May 1963; Journal of Applied Physics, vol. 44, No. 9; pp. 2885–2892.
Retrograde Solubility of Aluminum in Silicon-D. Navon and V. Chernyshov; Apr. 3, 1957; pp. 823–824.
Growth of Medium Electrical Resistivity CdSe Single Crystals by the Temperature Gradient Solution Zoning Technique—A. Burger & M. Roth; Journal of Crystal Growth 67; Mar. 10, 1984, pp. 507–512.
Germanium Saturated with Gallium Antimonide—J. O. McCaldin & D. B. Wittry; Aug. 26, 1960; Journal of Applied Physics, vol. 32, No. 1; pp. 65–69.
Analysis of the Temperature Distribution in FZ Silicon Crystals—H. K. Kuiken & P. J. Roksnoer; Jan. 2, 1979; Journal of Crystal Growth 47 (1979) pp. 29–42.
Materials with a bent for light—Simon Allen; Jul. 1, 1989; New Scientist; pp. 59–63.

(List continued on next page.)

*Primary Examiner*—Paul R. Michl
*Assistant Examiner*—Andrew E. C. Merriam
*Attorney, Agent, or Firm*—Brooks Haidt Haffner & Delahunty

[57] ABSTRACT

This invention relates to a method of producing polymer composites comprising a polymeric matrix (Host) in which crystallites of organic and/or inorganic compounds (Guest) are grown in situ. The growth of crystals is achieved by a temperature gradient zone melting technique. The resultant crystals have high crystalline alignment, good transparency and high second harmonic generation activity.

28 Claims, 8 Drawing Sheets

OTHER PUBLICATIONS

Synthesis of Conductive Polymers, Lewis Acid Doping of Terephthalaldehyde Polymers—Y. Takase, Hajime Tanaka, T. T. Wang, R. E. Cais, J. M. Kometani; Jun. 30, 1987; pp. 2320–2322.

Second harmonic generation in poled polymer films—K. D. Singer, J. E. Sohn & S. J. Lalama; Appl. Phys. Lett 49(5), Jun. 8, 1986 p. 248.

Thin Film Processing of Polymers for Nonlinenar Optics—R. D. Small; K. D. Singer, J. E. Sohn, M. G. Kuzyk & S. J. Lalama; SPIE vol. 682 Molecular & Polymeric Optoelectronic Materials; 1986, pp. 160–169.

Development of Polymeric Nonlinear Optical Materials—J. B. Stamatoff, A. Buckley, G. Calundann, E. W. Choe, R. DeMartino, G. Khanarian, T. Leslie, G. Nelson, D. Stuetz, C. C. Teng, H. N. Yoon; SPIE vol. 682 Molecular & Polymeric Optoelectronic Materials; pp. 85–92.

Second Harmonic Generation by Polymer Composites—P. D. Calvert & B. D. Moyle; Mat. Res. Soc. Symp. Proc. vol. 109; 1988 Materials Research Society; pp. 357–362.

Non-Linear Optical Processes in Optical Fibres—B. K. Nayar, K. I. White, G. Holdcroft & J. M. Sherwood; British Telecom Research Laboratories Martlesham Heath; undated; pp. 427–437.

Determination of Diffusivities in Liquid Metals by Means of Temperature-Gradient Zone Melting—J. H. Wernick; Aug. 24, 1955 The Journal of Chemical Physics, vol. 25, No. 1 pp. 47–49.

Apparatus for the Purification of Organic Compounds by Zone Melting—E. F. G. Herington, R. Handley & A. J. Cook; Apr. 28, 1956 Chemistry and Industry; pp. 292–295.

A Practical Method of Preparing Thin Homogeneous Ferroelectric Smectic Cells for Electro-Optical Microsecond Switches (II); Mar. 24, 1984.

Sm A Liquid Crystal Growth under a Temperature Gradient—K. Ishikawa, K. Hashimoto, H. Takezoe, A. Fukuda, E. Kuze; pp. L211–L213.

A New Technique for growing Highly Aligned Crystals in Composites Nazar Azoz; Apr. 8, 1989l; 3 pages.

FIG.1

Figure 2:
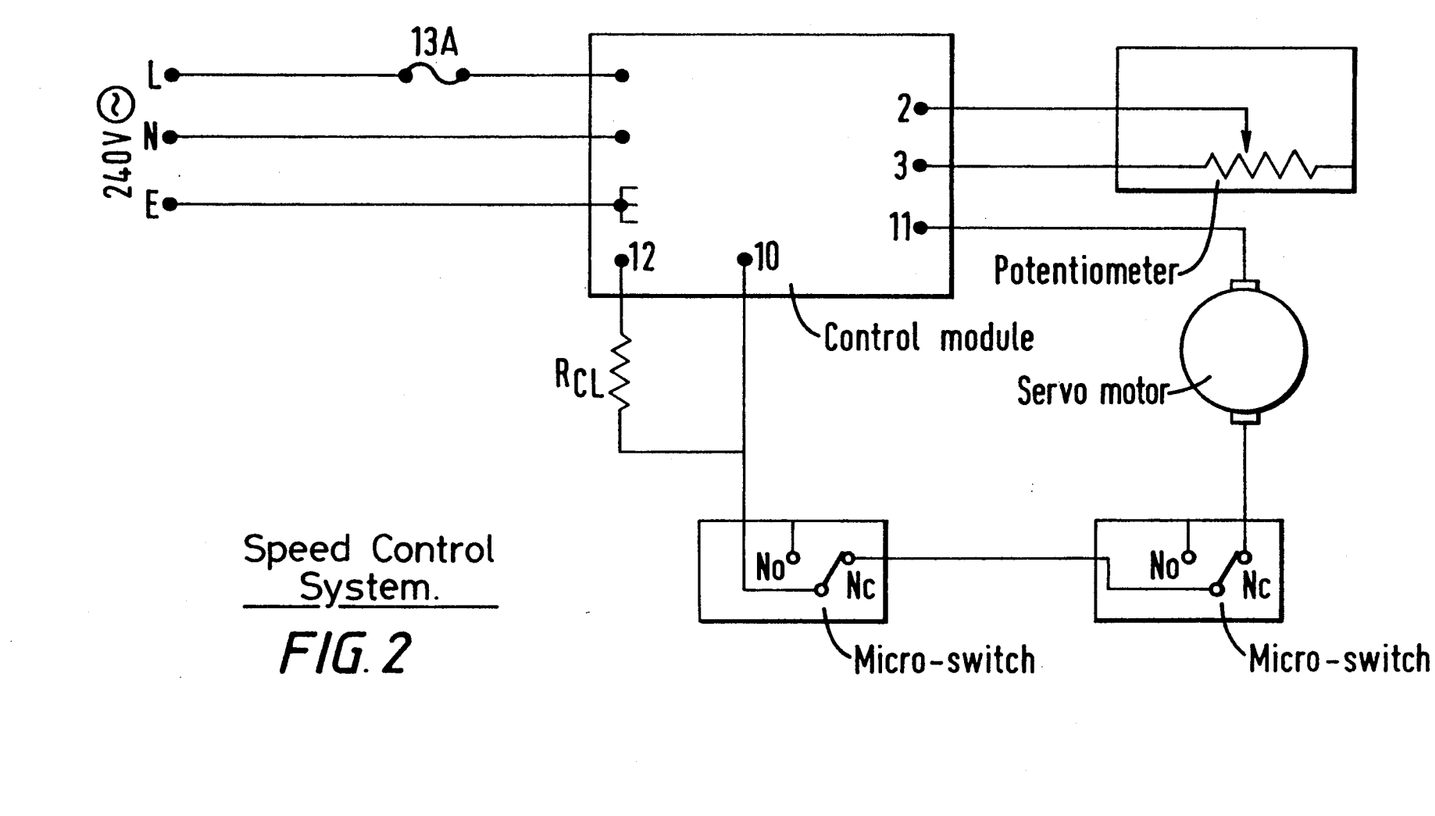

Speed Control System.
FIG. 2

POLYMER COMPOSITES

This invention relates to a method of producing polymer composites comprising polymeric matrices in which crystallites of organic and/or inorganic compounds are grown in situ.

It is well known that non-centrosymmetric crystals of some organic or inorganic compounds exhibit second-order, non-linear optical properties. By "non-centrosymmetric crystals" is meant here and throughout the specification crystals with crystallographic space groups which lack a centre of inversion symmetry. Such second-order, non-linear optical properties include for instance second harmonic generation (hereafter "SHG"), which is the ability of certain crystals to emit radiation, e.g. light, of a frequency which is double the frequency of the beam incident on said crystal. The frequency-doubled light for instance has many uses, a common one being the pumping of dye lasers in the laboratory.

Examples of non-centrosymmetric crystals capable of exhibiting such properties include potassium dihydrogenphosphate $K[H_2PO_4]$ (hereafter "KDP") and ammonium dihydrogenphosphate $[NH_4][H_2PO_4]$ (hereafter "ADP"). These crystals can multiply the frequency of incident infra-red or visible light. However, such crystals are expensive to make, are fragile and have relatively low coefficients for SHG necessitating the use of high input beam powers.

With the growth in integrated optics and associated fibre-optic communications there is a need for tough, flexible, highly efficient and physically compatible frequency doubling systems which also have temporal stability.

Some systems of this type and methods of producing the same are claimed and described in our published EP-A-232138. In this technique, principally, a solution of non-centrosymmetric compound being the nonlinear optical species (hereafter "Guest") and a polymer matrix material (hereafter "Host") in a solvent is cast as a film by controlled evaporation and the film is then oriented for alignment of Guest crystals in the Host thereby producing the desired composite having discrete interfaces or boundaries between the Guest crystals and the Host. One of the techniques suggested for alignment of molecules (not crystals) is by the application of high electric field to the cast film heated over the glass transition temperature, thereby aligning the Guest molecules in a Boltzmann distribution. When the electrical field is thereafter removed, the desired composite is formed. However, frequently, the alignment so achieved is relatively short-lived and the Guest molecules have a tendency to revert to a random state they were in before the application of the electrical field.

It is an object of the present invention to produce composites capable of SHG which mitigate some of the aforementioned problems.

Accordingly, the present invention is a method of producing composites capable of SHG in which crystals of a Guest compound are aligned in a Host material, said method comprising passing a film of the composite in which Host molecules are in a random state through a temperature gradient melting zone (hereafter "TGMZ") comprising a hot region and a cold region having a sharp temperature gradient therebetween, the temperature ($T_2$) of the hot region being above the melting point (and lower than its decomposition temperature) of the Guest compound but substantially within the elastic domain of the Host material, and the temperature ($T_1$) of the cold region being substantially below the melting point of the Guest compound thereby enabling said Guest compound to crystallise, whereby the film is passed through said zone (from $T_2$ to $T_1$) at a speed which enables alignment of the Guest crystals in the Host material to form the composite.

Instead of using a preformed film in which crystals of the Guest are in a random state in the Host, it is also possible to pass a solution of the Guest and Host compounds in a solvent placed on an appropriate substrate to generate the desired composites.

Thus according to a further embodiment, the present invention is a method of producing composites capable of SHG in which the crystals of a Guest compound are aligned in a Host material, said method comprising passing a solution of the Guest compound and the Host material in a solvent placed on an appropriate substrate which is inert under the conditions used through a temperature gradient melting zone (hereafter "TGMZ") comprising a hot region and a cold region having a sharp temperature gradient therebetween, the temperature ($T_2$) of the hot region being below the temperature at which the solvent boils, and the temperature ($T_1$) of the cold region being substantially below $T_2$ so as to enable the Guest compound to crystallise with the Host material, whereby the solution placed on the inert substrate is passed through the said zone from $T_1$ to $T_2$ at a speed which enables alignment of the Guest crystals in the Host material to form the composite.

The term "Guest" as used herein is meant to include both organic and inorganic crystals which are non-centrosymmetric and which exhibit second-order nonlinear optical properties.

Examples of organic compounds capable of forming non-centrosymmetric crystals include 3-nitroaniline (mNA) 3-methyl-4-nitropyridine-1-oxide, 2-methyl-4-nitroaniline (MNA), 2-dimethylamino-5-nitroacetanilide, urea and 2,4-dinitroaniline.

Examples of inorganic compounds capable of forming non-centrosymmetric crystals include KDP, ADP, lithium niobate(V), benzylammonium dihydrogenphosphate (BAP), piperidinium dihydrogen phosphate (PDP), barium sodium niobate(V), and lithium iodate(V).

By the term "Host" is meant a polymer matrix which includes matrices of both homo- and co-polymers.

The polymer matrix referred to herein is suitably in film form, preferably a thin film form. The films may have a thickness of up to 1 mm or more. It is also possible the material could be in other forms (e.g. rods).

Thus, the polymer chosen for the matrix may be any polymer capable of being formed into a film. Examples of polymers that can be used include polystyrene (PS), polyethylene, polyacrylamide (PAA), polymethylmethacrylate (PMMA), poly(vinylcarbazole) (PVK), poly(vinylacetate) (PVA), polypropylene, ethylene-ethyl acrylate copolymers, polyvinyl chloride, polyvinylidene fluoride, polyvinyl pyrrolidone (PVP), and polyoxyalkylene oxides such as polyethylene oxide (PEO).

The Guest compounds and Host materials are preferably such that when formed into a composite, said composites are transparent. It is possible to modify the refractive index matching of the composite by appropriate choice of the Guest compound and the Host material. The refractive indices of the Guest compound and the Host material may be the same or different. Dyes may be added to improve refractive index matching.

The relative concentrations of the Guest compound and the Host material should be such that the Guest compound is capable of crystallisation in the Host material, preferably as needle like crystals, when subjected to a temperature gradient zone melting (hereafter "TGZM") technique, thereby forming a composite in which there are at least two solid phases and there is a discrete interface or borderline between the Guest crystals and the Host material. To achieve this the composite suitably contains at least 10% w/w of the Guest compound in relation to the total weight of the Guest compound and the Host material, preferably at least 30% w/w and even more preferably at least 40% w/w of the Guest compound.

Where a preform film is cast from a solution of the Guest compound and the Host material prior to passing said films through the TGMZ, this film may be formed by any one of the following methods. For instance:

This may be achieved by high temperature extrusion of polymer pellets of the Host material in which the Guest organic or inorganic compounds to be crystallised have been dissolved e.g. by melt blending. The extrusion temperature is preferably just above the melting point of the higher melting of the Host material and Guest compound.

Alternatively, such crystals can be grown in situ in the Host polymer matrix by dissolving the Guest organic or inorganic compound to be crystallised and the matrix polymer in a common solvent and then casting the solution into the desired shape, e.g. a film, on a substrate, e.g. glass, thereby allowing the compound to crystallise randomly in situ in the matrix upon gradual evaporation of the solvent.

In a further method, a substrate, e.g. glass slide may be dipped into a common solution of the Host matrix polymer and the Guest compound in a solvent to be crystallised so as to form a coating of the solution on the substrate and then the solvent is allowed to evaporate from the coated substrate. The process may be repeated several times or the conditions modified to achieve the desired crystal density of film thickness.

In yet another process, the crystals may be grown in situ in the Host polymer matrix by precipitation. In this technique a solution of a first compound and the matrix polymer is cast into a film on a substrate, the film is then dipped into a solution of a second compound. The desired crystals of the Guest compound may then be formed in the polymer matrix in situ either by a reaction between the first and second compounds or by the displacement of the first compound from the film by the second compound which may be the one of which crystals are to be formed.

The specific technique chosen will depend upon several factors such as the nature of the polymer matrix, the crystals desired, the solubility of the compounds in any given solvent, the thickness of the polymer or the crystal density of the composite.

Whichever of the aforementioned techniques is used to grow the non-centrosymmetrical crystals in the polymer matrix, it is also necessary to orient the crystals grown in the polymer matrix so that all the crystals are substantially in parallel alignment. This will be essential if the composite is to act as a "single crystal" with respect to its electro-optical properties.

Once the preformed film has been produced, it is passed through the TGMZ in order to align the crystals of the Guest compound in the Host material.

In passing the preformed film through the TGMZ, the film may be suitably subjected to either a stretching effect under an induced strain or a drawing effect, or a combination of both, in order to aid the alignment of the crystals of the Guest compound in the Host material. This may be achieved for instance by the use of a driven motor at a predetermined speed.

The speed of drawing used is critical and will depend upon a number of variables including the temperature in the two regions of the TGMZ, the thickness of the film or the solution being passed through the zone, the concentration of the respective components in the preformed film or solution to be drawn, and the nature of the Guest compound or the Host material used.

The TGZM/technique is suitably carried out as follows:

The apparatus used is a TGZM apparatus and suitably consists of two aluminium blocks which form the hot and cold regions and they are suitably separated by a thin, e.g. at least 1 mm, thermally insulating layer to form a thermal junction. One block is heated to the desired temperature $T_2$ and the other cooled to a temperature $T_1$ in order to create a sharp temperature gradient. The hot block is suitably heated by any convenient means e.g. cartridge heaters inserted into the aluminium block and the cold block may be cooled e.g. by water or other coolant circulation. An enclosed channel may be provided on top of the aluminium blocks to allow the sample to be drawn across the thermal junction so formed. A sample holder can then be connected by means of a lead screw and a gear box to a motor which will enable the sample to be drawn from the hot to the cold region (block) of the apparatus at a predetermined rate.

For instance, to form a polymer composite from mNA and PMMA, solutions of varying concentrations are prepared using toluene as solvent. Thin films (e.g. 30–40 micrometers) are then cast on glass slides and allowed to dry to produce the preformed films. The preformed film is then covered with a second glass slide and placed in a sample holder of the TGZM device on the hot block. For this mNA/PMMA Guest/Host combination, the hot region was maintained at 150° C. (i.e. above the melting point of mNA) and the cold region was maintained at about 20° C. When the sample in the hot region had softened, it is drawn slowly across the thermal junction at the optimised conditions of temperature differential, drawing speed etc, the Guest compound crystallises in a line within the Host material as it traverses the temperature gradient. In this case the crystals appear as fibre-like needles aligned parallel to the drawing axis. There is no measurable decay of SHG-activity with time (e.g. over a period of more than two years).

As an example of the case where the SHG-active composites are made from solution, BAP was used as the Guest and PAA or PEO were used as the Host. The solution is suitably prepared in water. The solvent (in this case, water) is evaporated using a thermal gradient and the product is a colourless, transparent and non-scattering composite containing highly aligned microcrystals of BAP within the polymer Host.

Specifically, the necessary alignment may be achieved by dipping a microscope slide in a solution of the Guest and the Host. The slide is then placed in an enclosed channel on top of a metal block where one end of the metal block is heated, which generates a thermal gradient, forming a heated end and a cold end in a manner as described above.

Again, as previously, by optimising the temperature differential and the pulling speed, alignment of the crystals is achieved by pulling the slide across the thermal gradient, but from cold to hot. A microscopic examination of the product reveals that the needle like crystals of BAP are aligned parallel to the pulling axis.

The thickness of the film in this case can be varied but is typically from 30-50 micrometers. The SHG activities of these films were tested using a Nd:YAG laser irradiating at 1064 nm.

With PAA films, the molecular weight of the polymer Host is suitably from 2,000,000-5,000,000, typically 4,000,000, and the loading degree can be varied from 50-70%. For PEO films on the other hand, the molecular weight may vary from 100,000-1,000,000, and the loading degree may be between 50 and 60%.

Neither of these films showed any decay when exposed to high intensity laser light and there was no change in the SHG-activity with time, e.g. over 12 months. This would lead to the conclusion that the alignment of the Guest is permanent.

This method makes it possible to use a much wider range of Guests and Hosts, especially those which cannot be melted or softened due to risk of decomposition, in the process of the present invention. Thus composites may be formed from e.g. high melting polymers and high melting or low thermal stability Guest compounds.

The optical quality of the composites so formed can be evaluated using optical microscopy, and the intensity and angular distribution of helium-neon laser scattering can also be determined by well known techniques. The efficiency of SHG was determined by irradiating the sample of the composite with 1064 nm IR radiation from Nd:YAG laser and observing the visible light at 532 nm; the intensity was measured by a photomultiplier.

Apart from the method of carrying out the invention, it should be understood that the device used for this purpose was designed and constructed as a novel tailor-made device for this investigation.

Hence the present invention also covers the device used for producing these composites as an additional embodiment.

The composites produced according to the present invention have high temporal stability.

The present invention is further illustrated with reference to the following description of apparatus and Examples:

APPARATUS DESCRIPTION

Figure 1:
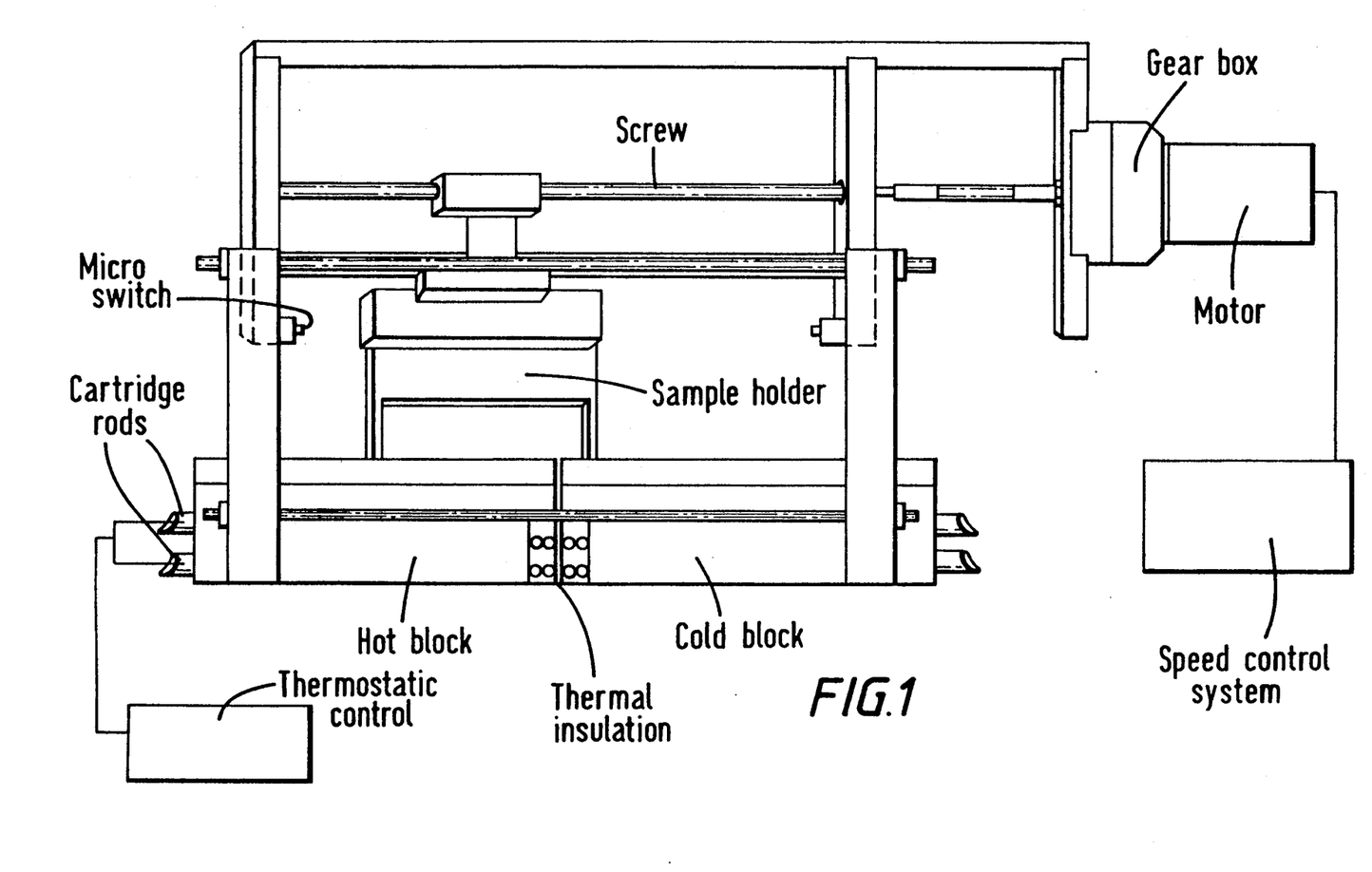

The apparatus consists of two aluminium blocks which are connected by a 1 mm thermally insulating layer (Kaowool ceramic fibre insulation); the sample holder is connected to a motor, and temperature and speed control systems (see FIG. 1).

One of the aluminium blocks was heated and the other was cooled, in order to produce a sharp temperature gradient between the two blocks. The hot block was heated by heaters (two cartridge rods) which were inserted (hidden) within the block, and its temperature was controlled by a thermocouple sensor feedback system. The cold block was cooled by a liquid circulating system, in which cold water ran through channels inside the block. By controlling the amount of the circulating water (by controlling the circulating speed), the temperature of the cold block was controlled. This temperature was measured by inserting a thermocouple in a channel inside the cold block: the temperature step ($T_{hot} - T_{cold}$) was measured within an accuracy of $+/- 2°$ C.

An enclosed channel on the top of the blocks enabled the sample to be pulled across the temperature step. The sample holder was connected to a screw, which was connected to a gearbox and a motor enabling it to be driven at various speeds.

The speed control system was consisted of:
D.C. servo motor (control module)
Precision D.C. servo motor (12 V)
Multiturn potentiometer, wire wound, 3 Watts, 5K ohms
Digital 10 turns.

These parts were connected, as shown in FIG. 2, to supply a range of speeds.

In FIG. 2, the servo control module was connected to a 240 V power source. A potentiometer (5K ohms) was connected to terminals 2 and 3 of the control module. The potentiometer was connected in order to produce various input voltages going into the servo motor via terminal 11 in the control module and therefore produce various drawing speeds. The relationship between the control potentiometer angular displacement and the motor rotation was established by prior calibration.

To prevent faults occuring in the system due e.g. to over-running of the motor a micro-switch was fixed at each end of the apparatus (as shown in FIG. 1) to turn the motor off once the sample reached either end. The servo motor was connected to terminal 10 in the control module through these microswitches.

To obtain the desired range of speeds, a gearbox was attached to the motor.

The apparatus was provided with a current limit resistor ($R_{cl}$) to prevent build up of current and thereby cause damage to the motor or the gearbox.

The speed control system was calibrated by measuring the distance, through which the sample was pulled in a certain time, using twelve digital settings (in the range 1-500) of the potentiometer. The speed was then calculated by applying:

speed = distance/time

Figure 3:
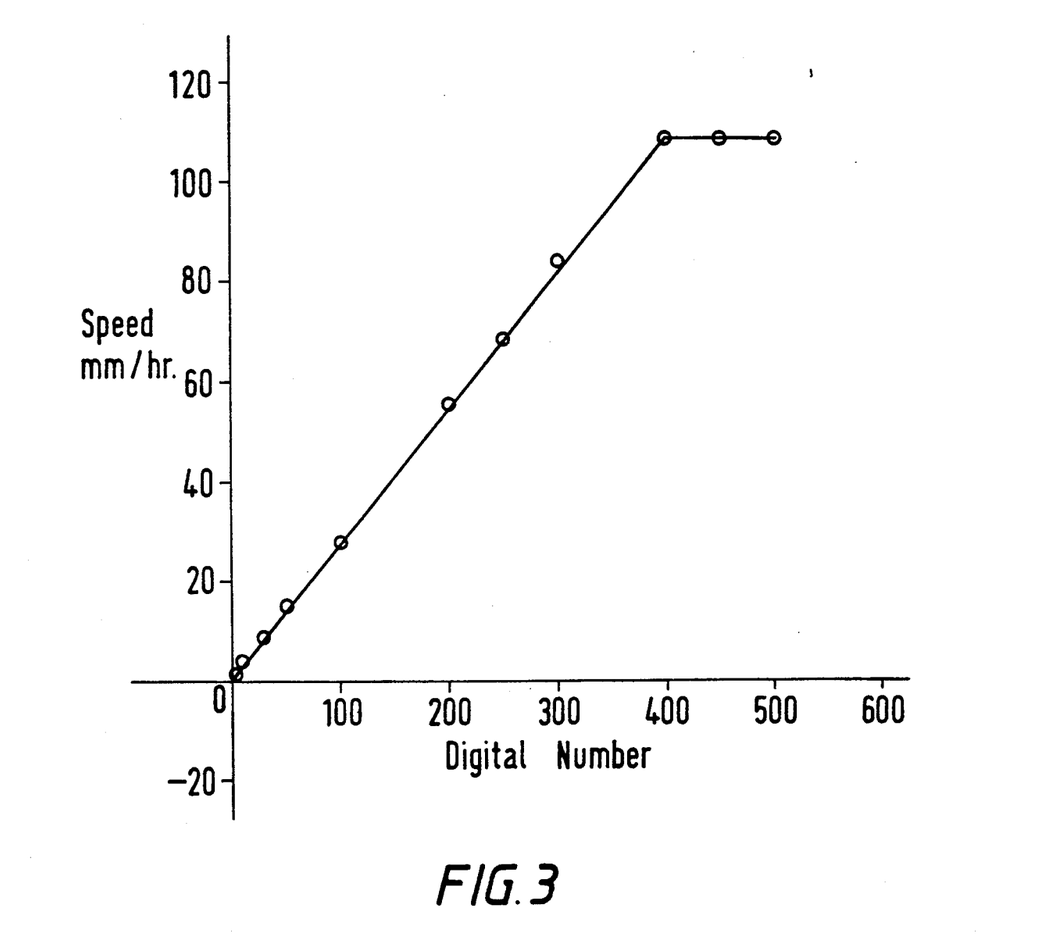

Therefore, each digital number corresponds to a certain pulling speed, as shown in FIG. 3. (See tabulated format of FIG. 3 below). This arrangement enabled the sample to be pulled across the temperature step at any rate between 0.6 mm h$^{-1}$ and 102 mm h$^{-1}$. Calibration data on Temp. Gradient Speed Control

| Digit No. | Speed mm/hr. |
|---|---|
| 500 | 108 mm/hr. |
| 400 | 108 |
| 300 | 84 |
| 250 | 61.2 |
| 200 | 54 |
| 150 | 39 |
| 100 | 28 |
| 50 | 12 |
| 30 | 8.615 |
| 10 | 3.75 |
| 5 | 2.0 |
| 3 | 1.335 |

The heating control system consisted of:

Temperature controller (range 0°–400° C.).
Analogue deviation meter (50-0-50 microampares).
Cartridge heaters.
Thermocouple sensor, type K.

Figure 4:
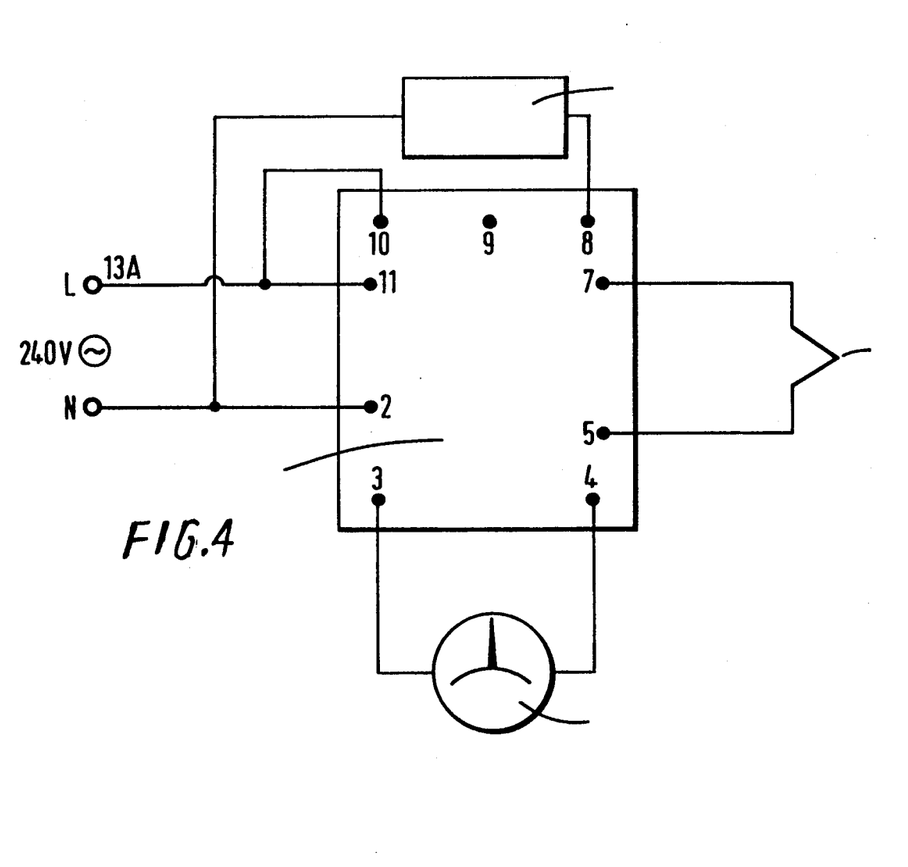

In FIG. 4, a temperature controller was connected to a 240 V power source and to two cartridge heaters via terminal 8 to provide temperature range of 0°–400° C. An external deviation meter (50-0-50 micro Amp) was connected via terminals 3 and 4 to the temperature controller in order to provide a more accurate reading of the temperature. A thermocouple sensor (type K) was connected to the temperature controller via terminals 5 and 7. The heaters were connected with the temperature controller in such a manner that if the temperature sensed by the sensor is below the set temperature, the output will be 'on', and if the temperature sensed is above the set temperature, the output will be 'off'.

EXAMPLE 1

Solutions of different concentrations of the composite mNA/PMMA were prepared using toluene as a solvent (typically 15 g of mNA/PMMA mixture in 100 cm$^3$ solvent). Thin films of the composite (30–40 micrometers) were cast on microscope glass slides and left to dry. Then each film was sandwiched between two glass slides and placed in the channel in the hot region of the aluminium block to melt, and then it was pulled at a certain speed towards the cold region. The hot block was kept at 150° C., which is higher than the melting point of the mNA (114° C.) and lower than the decomposition point of the PMMA (160° C.). The other block was cooled to about 20° C. by circulating cold water in it. The sample was kept in the channel in the hot region until it had melted or softened. Then the sample was drawn at a certain speed across the sharp temperature gradient from hot end to cold end. As the hot composite film reached the temperature step, it froze (crystallised) in a line across the film, and as it traversed across the gradient, the crystals grew as aligned fibres parallel to the axis of the film, as is shown in FIG. 5.

Figure 5:
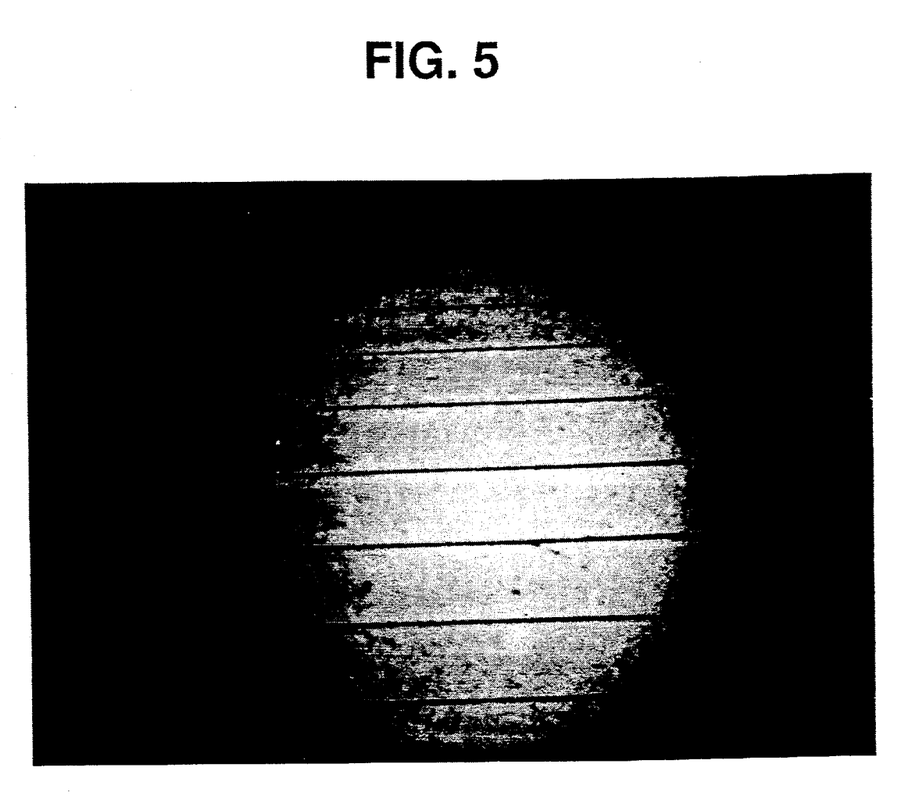
Figure 6:
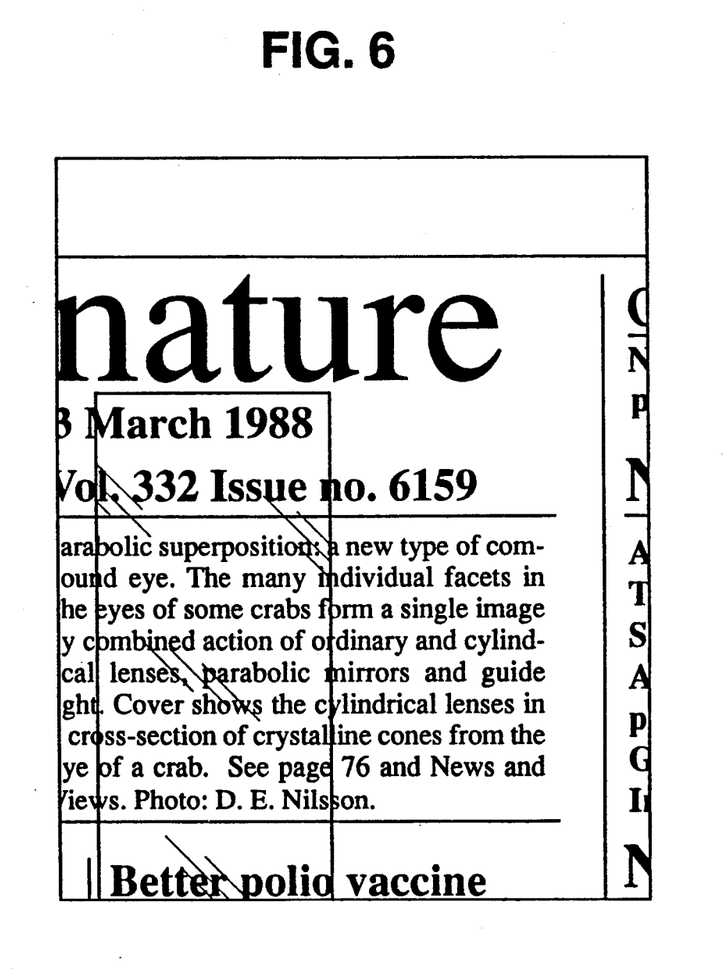
Figure 7:
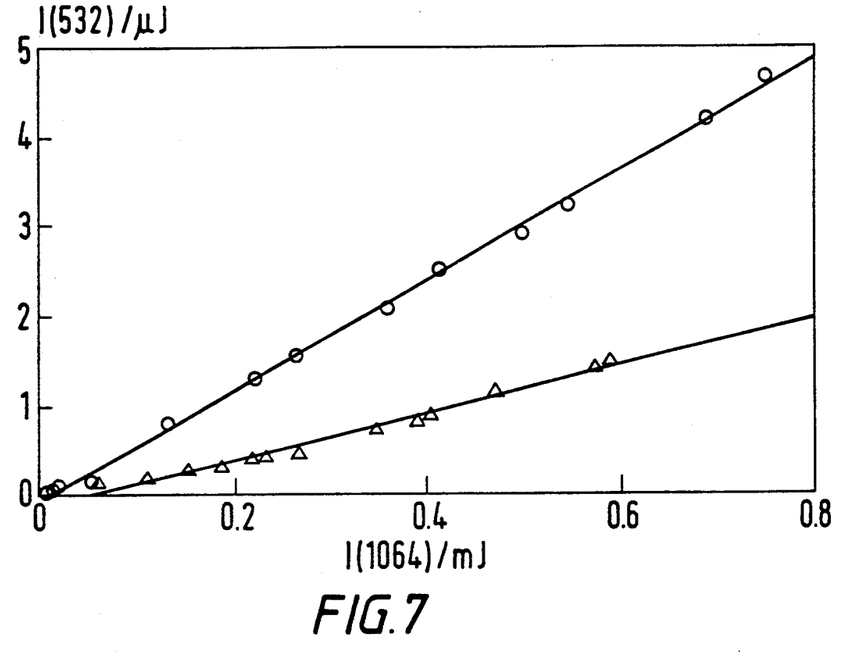

FIG. 5 shows a sample of mNA in PMMA (70 wt %) under the polarizing microscope: the crystals of mNA adopt a needle-like habit, which is strongly aligned along the drawing axis, i.e. along the direction of the thermal gradient. The technique resulted in excellent alignment of the organic nonlinear optical material in the rigid polymer matrix. FIG. 6 gives an indication of the transparency obtained with the method. He-Ne laser scattering provided a quantitative measure of optical quality, and FIG. 7 shows the scattering intensity of 632 nm light as a function of angle for both an aligned ( ) and a partially aligned (o) sample. For the aligned sample (70% mNA in PMMA), the angular scattering pattern was narrow and symmetric about zero degrees (the forward direction). The peak represented transmissions at 632 nm of 88.7%. Higher peak transmissions were achieved using PVK as the polymer Host with a concomitantly narrower angular distribution (a result of improved refractive index matching between Guest and Host).

Figure 8:
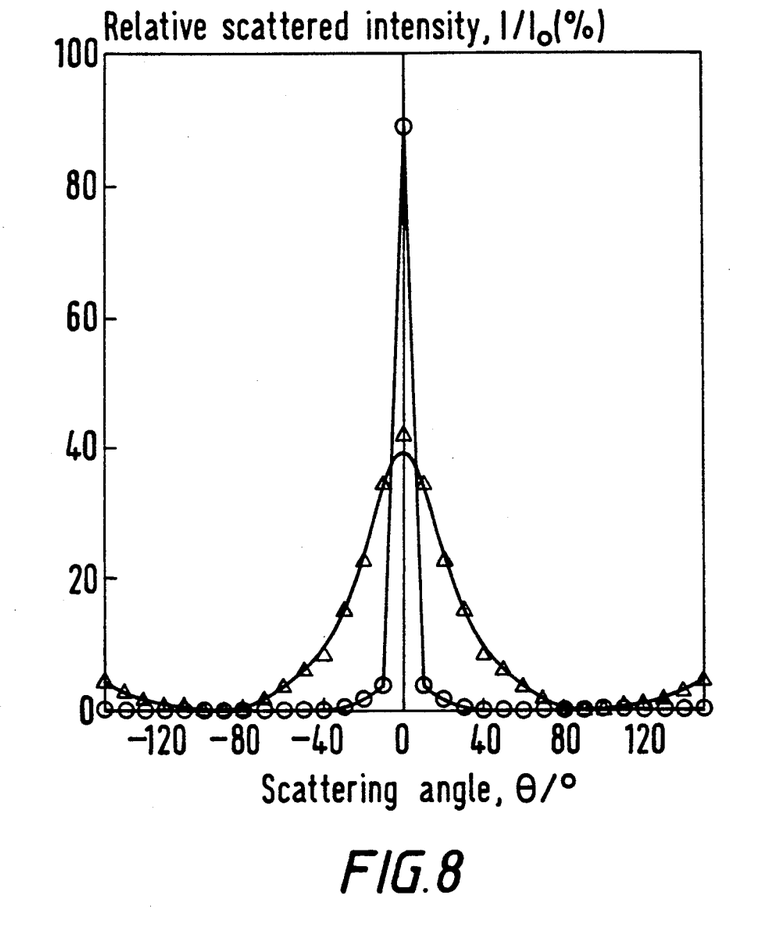

The most dramatic results came from study of the efficiency of SHG (FIG. 8) for the aligned and partially aligned samples mentioned above. There is a striking increase in the SHG efficiency, which is highly dependent upon the degree of crystalline alignment. There is also a marked narrowing of the SHG angular distribution, as crystal alignment increases, with the majority of the intensity being forward-scattered. The best-aligned sample gave an SHG intensity that was over 400 times greater than that of powdered KDP. This indicated that these composite materials represented a remarkably efficient frequency-doubling medium.

Figure 9:
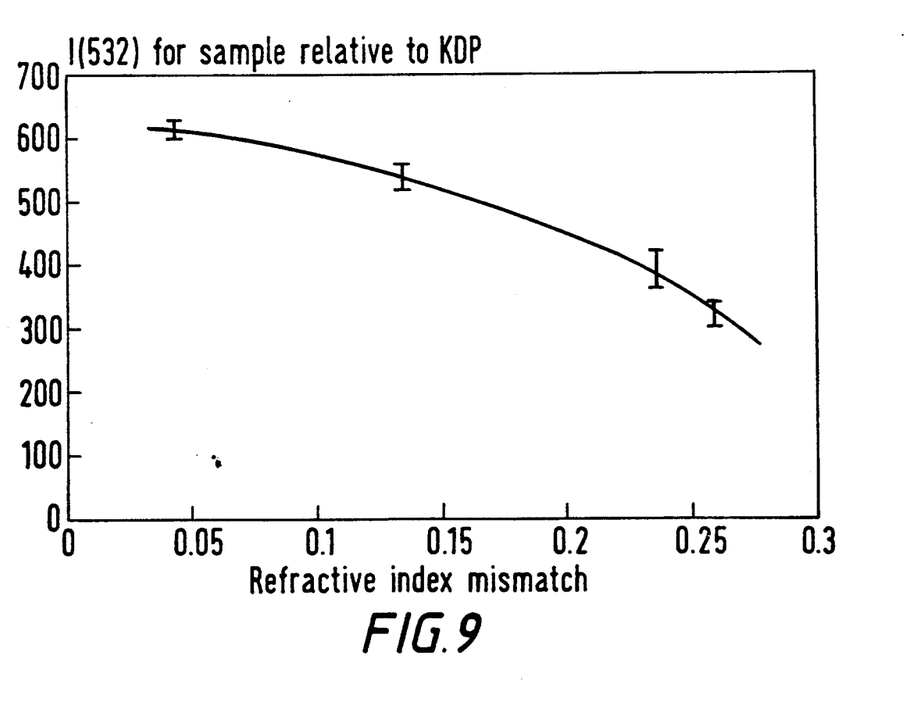

SHG efficiency may be enhanced further by suitable choice of polymer Host, since refractive index matching may be achieved. This is demonstrated most clearly in FIG. 9, where SHG efficiency was plotted as a function of refractive index mismatch (n) using several polymeric host species of differing refractive index.

Finally, the chemical and optical stability of these novel composite materials must be emphasised. The samples illustrated have shown unchanged clarity, composition and SHG efficiencies for more than 2 years. This is considerably in excess of lifetimes of aligned composites produced by other methods and augurs well for their incorporation into optoelectronic devices, such as wave guides.

EXAMPLE 2

Poly(acrylamide) (1.5 g, Mw: 4,000,000–5,000,000) was dissolved in water (40 cm$^3$) by stirring overnight (12 h) at 20° C. This produced an opaque solution. Benzylammonium dihydrogenphosphate (1.2 g) was then dissolved in the polymer solution.

In order to remove any air bubbles from the solution, it was then placed, contained in a beaker, in a sonic bath for 10 min.

A film was then cast onto a microscope slide by dipping it into the mixture. Afterwards, one side of the slide was carefully wiped clean. The slide was then placed, clean side down, in the thermal-gradient apparatus.

A thermal gradient was created across the apparatus by heating one end to 70° C., keeping the other end at 20° C. The slide was finally pulled along the apparatus from cold end to hot end at a speed of 84 mm/hour which produced a transparent, colourless, SHG-active composite.

EXAMPLE 3

Polyethyleneoxide (1.2 g, Mw: 100,000) was dissolved in water (40 cm$^3$) by stirring for 4 h at 20° C. Benzylammonium dihydrogenphosphate (1.8 g) was then dissolved in the aqueous polymer solution.

The mixture was placed in a sonic bath for 10 min in order to remove any air bubbles.

A film was then cast onto a microscope slide by dipping it into the mixture. Afterwards, one side of the slide was carefully wiped clean. The slide was then placed, clean side down, in the thermal-gradient apparatus.

A thermal gradient was created across the apparatus by heating one end to 63° C., keeping the other end at 20° C. The slide was finally pulled across the gradient from cold end to hot end at 108 mm/hour to produce a transparent, colourless, SHG-active composite.

EXAMPLE 4

Poly(vinylpyrrolidone) (PVP, 1.0 g, Mw: 40000) was dissolved in water (40 cm$^3$) by stirring for 4 h at 20° C. Benzylammonium dihydrogenphosphate (BAP, 2.0 g) was then dissolved in the transparent aqueous polymer solution. The mixture was placed in a sonic bath for 10 mins in order to remove any air bubbles and to ensure that the Guest compound (benzylammonium dihydrogenphosphate) had dissolved completely.

A film was then cast onto a microscope slide by dipping it into the mixture. Afterwards, one side of the slide was carefully wiped clean. The slide was then placed, clean side down, in the thermal-gradient apparatus.

A thermal gradient was created across the apparatus by heating one end to 70° C., keeping the other end at 20° C. The slide was finally pulled across the gradient at 108 mm/hour to produce a transparent, colourless, SHG-active composite.

EXAMPLE 5

Poly(acrylamide) (PAA, 1.5 g, Mw: 4000000–5000000) was dissolved in water (40 cm$^3$) by stirring overnight (12 h) at 20° C. This produced an opaque solution. Piperidinium dihydrogenphosphate (PDP, 1.2 g) was then dissolved in the polymer solution.

In order to remove any air bubbles from the solution, it was then placed, contained in a beaker, in a sonic bath for 10 mins.

A film was then cast onto a microscope slide by dipping it into the mixture. Afterwards, one side of the slide was carefully wiped clean. The slide was then placed, clean side down, in the thermal-gradient apparatus.

A thermal gradient was created across the apparatus by heating one end to 70° C., keeping the other end at 20° C. The slide was finally pulled along the apparatus at a speed of 84 mm/hour which produced a transparent, colourless, SHG-active composite.

EXAMPLE 6

Polyethyleneoxide (PEO, 1.2 g, Mw: 100000) was dissolved in water (40 cm$^3$) by stirring for 4 h at 20° C. Piperidinium dihydrogenphosphate (PDP, 1.8 g) was then dissolved in the aqueous polymer solution.

The mixture was placed in a sonic bath for 10 mins in order to remove any air bubbles.

A film was then cast onto a microscope slide by dipping it into the mixture. Afterwards, one side of the slide was carafully wiped clean. The slide was then placed, clean side down, in the thermal-gradient apparatus.

A thermal gradient was created across the apparatus by heating one end to 63° C., keeping the other end at 20° C. The slide was finally pulled across the gradient at 108 mm/hour to produce a transparent, colourless, SHG-active composite.

EXAMPLE 7

Poly(vinylpyrrolidone) (PVP, 1.0 g, Mw: 40000) was dissolved in water (40 cm$^3$) by stirring for 6 h at 20° C. Piperidinium dihydrogenphosphate (PDP, 2.0 g) was then dissolved in the transparent aqueous polymer solution. The mixture was placed in a sonic bath for 10 min in order to remove any air bubbles and to ensure that the Guest compound (piperidinium dihydrogenphosphate) had dissolved completely.

A film was then cast onto a microscope slide by dipping it into the mixture. Afterwards, one side of the slide was carefully wiped clean. The slide was then placed, clean side down, in the thermal-gradient apparatus.

A thermal gradient was created across the apparatus by heating one end to 70° C., keeping the other end at 20° C. The slide was finally pulled across the gradient at 108 mm/hour to produce a transparent, colourless, SHG-active composite.

EXAMPLE 8

Hot solutions of mNA/PMMA (15 g; 50%, 60% and 70% wt of mNA Guest in the total of Guest and Host) in toluene (100 ml) were prepared and films of these compositions were cast on to a microscope slide by dipping the slide into the respective hot solutions.

The composite films so formed were then dried and thereafter another glass slide was placed on top of the dried composite film. A thermal gradient was created by heating one end of the TGMZ to 150° C. and cooling the other to 20° C. The sample of the composite sandwiched between the two glass slides was placed on the hot end and then drawn towards the cold end. Best results in terms of alignment of crystals in the composite, transparency and SHG activity was observed at the following drawing speeds for the respective concentrations of the Guest and Host:

| mNA | Drawing Speed (mm/hr) |
| --- | --- |
| 50% | 0.6 |
| 60% | 10.0 |
| 70% | 68.0 |

In these cases the products were found to be highly aligned, highly transparent and the SHG activity (as determined by a Nd-YAG laser using KDP powder thickness of 200 micrometers as reference sample) in each case was $> \times 400$ of the KDP reference sample.

EXAMPLE 9

| mNA mNA/PS mNA/PVK | 50% wt mNA Guest in the total of the Guest & Host |
| --- | --- |

Samples of these composites were prepared as in Example 8 above. The samples were produced to examine the effect of refractive index matching on SHG activity. As would be apparent, if the refractive index of the Guest and Host are substantially transparent product which in turn results in a high SHG activity. The measured refractive indices of these samples were as follows:

|  | Refractive Index of | |
| --- | --- | --- |
|  | Host | mNA |
| mNA/PMMA | 1.50 | 1.72 |
| mNA/PVA | 1.47 | 1.72 |
| mNA/PS | 1.59 | 1.72 |
| mNA/PVK | 1.68 | 1.72 |

COMPARATIVE TEST NOT ACCORDING TO THE INVENTION

The process of Example 8 was repeated to produce a 2-pyrrolidone-5-nitroacetanilide (PAN)/PMMA composite. In this case no alignment was observed upon examination under a polarised optical microscope because of the high melting temperature of PAN (220° C.). Such high temperatures caused the polymer host to decompose.

EXAMPLE 10

2-dimethylamino-5-nitro acetanilide (DAN)/PMMA (55%, 60% and 70% wt of DAN Guest in the total of Guest and Host) composites produced according to the procedure in Example 8 above was drawn through a temperature gradient of 180° C. to 25° C. (hot to cold). The composites were found to be highly aligned, transparent and highly SHG efficient. Best results were achieved at the following drawing speeds for the respective Guest concentrations.

55% 1 mm/hr
60% 15 mm/hr
70% 70 mm/hr

EXAMPLE 11

A DAN/PVK (70% wt of DAN Guest in the total of Guest and Host) composite produced according to the procedure of Example 10 except that PVK was used as the Host material. The drawing speed used was 18 mm/hr and DAN had a refractive index of 1.73 which compares favourably with the mNA/PVK composite in Example 9 above. The composite was found to be highly aligned, highly transparent and highly SHG active.

EXAMPLES 12 (FROM AQUEOUS SOLUTION)

Composites of BAP/PAA (mol wt $4 \times 10^6$; 50%, 60% and 70% wt of Guest BAP in the total of Guest and Host) solutions were prepared according to the procedure in Example 2 using a temperature gradient of 20°–70° C. (cold to hot). Best results were achieved using the following drawing speeds:

50% 84 mm/hr
60% 68 mm/hr
70% 58 mm/hr

The composites were highly aligned, highly transparent and had high SHG activity.

EXAMPLE 13 (FROM AQUEOUS SOLUTION)

A range of BAP/PEO (60% wt of BAP Guest in the total of Guest and Host) composites using PEO of molecular weights 100000, 300000, 600000, 900000 and $4 \times 10^6$ were produced according to the procedure in Example 2 and a temperature gradient of 20°–63° C. (cold to hot). The drawing speed was 102 mm/hr. The resultant composites had good alignment, transparency and high SHG activity. It was observed that the lower the molecular weight of the Host the higher the degree of crystal alignment and the higher the transparency and SHG activity of the composite.

EXAMPLE 14 (FROM AQUEOUS SOLUTION)

A BAP/PVP (60% wt BAP Guest in the total of Guest and Host) Mol Wt 44000) composite was prepared according to the procedure in Example 2 and a temperature gradient of 20°–70° C. (cold to hot) using a drawing speed of 10 mm/hr. The resultant product had high alignment, high transparency and high SHG activity.

EXAMPLE 15 (FROM AQUEOUS SOLUTION)

A PDP/PVP (80% wt Guest PDP in the total of Guest and Host, Mol Wt 44000) composite was prepared according to the procedure in Example 2 and a temperature gradient of 20°–70° C. using a drawing speed of 102 mm/hr. The resultant composite had high transparency, was highly aligned and had high SHG activity.

EXAMPLE 16 (FROM NON-AQUEOUS SOLUTION)

An mNA/PMMA (50% wt mNA Guest in the total of Guest and Host) composites were prepared according to the procedure in Example 2 except that the solvent used was n-butyl acetate and not water. The temperature gradient used was 20°–50° C. (cold to hot) and the drawing speed was 100 mm/hr. The resultant composite had high transparency, was highly aligned and had high SHG activity.

We claim:

1. A method of producing composites capable of second harmonic generation (hereafter "SHG") in which crystals of a Guest compound are aligned in a Host material, said method comprising passing a film of the composite in which the Guest compound in the Host material are in a random state through a temperature gradient melting zone (hereafter "TGMZ") comprising a hot region and a cold region having a sharp gradient therebetween, the temperature ($T_2$) of the hot region being above the melting point of the Guest compound but substantially within the elastic domain of the Host material, and the temperature ($T_1$) of the cold region being substantially below the melting point of the Guest compound thereby enabling said Guest compound to crystallise, whereby the film is passed through said zone from hot end to cold end at a speed which enables alignment of the Guest crystals in the Host material to form the composite.

2. A method of producing composites capable of SHG in which the crystals of a Guest compound are aligned in a Host material, said method comprising passing a solution of the Guest compound and the Host material in a solvent placed on an appropriate substrate which is inert under the conditions used through a temperature gradient melting zone (hereafter "TGMZ") comprising a hot region and a cold region having a sharp temperature gradient therebetween the temperature ($T_2$) of the hot region being below the temperature at which the solvent boils, and the temperature ($T_1$) of the cold region being substantially below $T_2$ so as to enable the Guest compound to crystallise with the Host material, whereby the solution placed on the inert substrate is passed through the said zone from cold end to hot end at a speed which enables alignment of the Guest crystals in the Host material to form the composite.

3. A method according to claim 1 wherein the Guest is an organic or inorganic compound capable of forming non-centrosymmetric crystals and exhibiting second-order nonlinear optical properties.

4. A method according to claim 1 wherein the organic compound is selected from 3-nitroaniline (hereafter "mNA"), 3-methyl-4-nitropyridine-1-oxide, 2-methyl-4-nitroaniline (hereafter "MNA"), 2-dimethylamino-5-nitroacetanilide, urea and 2,4-dinitroaniline.

5. A method according to claim 1 wherein the inorganic compound is potassium dihydrogenphosphate, ammonium dihydrogenphosphate, benzylammonium dihydrogenphosphate, piperidinium dihydrogen phosphate and lithium iodate.

6. A method according to claim 1 wherein the Host material is a polymer matrix which may either be a homopolymer or a copolymer.

7. A method according to claim 6 wherein the polymer matrix is in film form.

8. A method according to claim 6 wherein the polymer in the matrix is selected from polystyrene, polyethylene, polyacrylamide, polymethylmethacrylate, poly(vinyl carbazole), poly(vinyl acetate), polypropylene, ethylene-ethyl acrylate copolymers, polyvinyl chloride, polyvinylidene fluoride, poly(vinyl pyrrolidone) and poly-oxyalkylene oxides.

9. A method according to claim 1 wherein the relative concentrations of the Guest compound and the Host material are such that the Guest compound is capable of crystallisation in the Host material when subjected to a temperature gradient zone melting technique, thereby forming a composite in which there are at least two solid phases and there is a discrete interface or borderline between the Guest crystals and the Host material.

10. A method according to claim 9 wherein the composite contains at least 10% w/w and upto <100% of the Guest compound in relation to the total weight of the Guest compound and the Host material.

11. A method according to claim 1 wherein a preformed film is cast from a solution of the Guest compound and the Host material prior to passing said film through the TGMZ.

12. A method according to claim 1 wherein the film is formed by high temperature extrusion of polymer pellets of the Host material in which the Guest organic or inorganic compounds to be crystallised have been dissolved by melt blending and the extrusion temperature is just above the melting point of the higher melting of the Host material and the Guest compound.

13. A method according to claim 1 wherein the crystals of the Guest compound are grown in situ in the Host polymer matrix by dissolving the Guest organic or inorganic compounds to be crystallised and the polymer matrix in a common solvent and then either casting the solution into the desired shape on a substrate or dipping the substrate in the solution so as to form a coating of the solution on said substrate and then allowing the Guest compound to crystallise in situ in the matrix upon gradual evaporation of the solvent from the caste shape or coated substrate respectively.

14. A method according to claim 1 wherein the crystals of the Guest compound are grown in situ in a Host polymer matrix by a precipitation technique in which a solution of a first compound and the matrix polymer is cast into a film on a substrate and the film so formed is dipped into a solution of a second compound whereby the desired crystals of the Guest compound are formed in situ either by reaction between the first and second compounds or by displacement of the first compound from the film by the second compound.

15. A method according to claim 1 wherein the alignment of the crystals of the Guest compound in the Host material is aided by subjecting the film passing through the TGMZ to a stretching effect under induced strain or a drawing effect or a combination or both.

16. A method according to claim 2 wherein the Guest is an organic or inorganic compound capable of forming non-centrosymmetric crystals and exhibiting second-order nonlinear optical properties.

17. A method according to claim 2 wherein the organic compound is selected from 3-nitroaniline (hereafter "mNA"), 3-methyl-4-nitropyridine-1-oxide, 2-methyl-4-nitroaniline (hereafter "MNA"), 2-dimethylamino-5-nitroacetanilide, urea and 2,4-dinitroaniline.

18. A method according to claim 2 wherein the inorganic compound is potassium dihydrogenphosphate, ammonium dihydrogenphosphate, benzylammonium dihydrogenphosphate, piperidinium dihydrogen phosphate and lithium iodate.

19. A method according to claim 2 wherein the Host material is a polymer matrix which may either be a homopolymer or a copolymer.

20. A method according to claim 19 wherein the polymer matrix is in film form.

21. A method according to claim 19 wherein the polymer in the matrix is selected from polystyrene, polyethylene, polyacrylamide, polymethylmethacrylate, poly(vinyl carbazole), poly(vinyl acetate), polypropylene, ethylene-ethyl acrylate copolymers, polyvinyl chloride, polyvinylidene fluoride, poly(vinyl pyrrolidone) and poly-oxyalkylene oxides.

22. A method according to claim 2 wherein the relative concentrations of the Guest compound and the Host material are such that the Guest compound is capable of crystallisation in the Host material when subjected to a temperature gradient zone melting technique, thereby forming a composite in which there are at least two solid phases and there is a discrete interface or borderline between the Guest crystals and the Host material.

23. A method according to claim 22 wherein the composite contains at least 10% w/w and upto <100% of the Guest compound in relation to the total weight of the Guest compound and the Host material.

24. A method according to claim 2 wherein a preformed film is cast from a solution of the Guest compound and the Host material prior to passing said film through the TGMZ.

25. A method according to claim 2 wherein the film is formed by high temperature extrusion of polymer pellets of the Host material in which the Guest organic or inorganic compounds to be crystallised have been dissolved by melt blending and the extrusion temperature is just above the melting point of the higher melting of the Host material and the Guest compound.

26. A method according to claim 2 wherein the crystals of the Guest compound are grown in situ in the Host polymer matrix by dissolving the Guest organic or inorganic compounds to be crystallised and the polymer matrix in a common solvent and then either casting the solution into the desired shape on a substrate or dipping the substrate in the solution so as to form a coating of the solution on said substrate and then allowing the Guest compound to crystallise in situ in the matrix upon gradual evaporation of the solvent from the caste shape or coated substrate respectively.

27. A method according to claim 2 wherein the crystals of the Guest compound are grown in situ in a Host polymer matrix by a precipitation technique in which a solution of a first compound and the matrix polymer is cast into a film on a substrate and the film so formed is dipped into a solution of a second compound whereby the desired crystals of the Guest compound are formed in situ either by reaction between the first and second compounds or by displacement of the first compound from the film by the second compound.

28. A method according to claim 2 wherein the alignment of the crystals of the Guest compound in the Host material is aided by subjecting the film passing through the TGMZ to a stretching effect under induced strain or a drawing effect or a combination or both.

* * * * *

UNITED STATES PATENT AND TRADEMARK OFFICE
CERTIFICATE OF CORRECTION

PATENT NO. : 5,167,888
DATED : December 1, 1992
INVENTOR(S) : NAZAR E.N. AZOZ and MUNTESER M. KADIM It is certified that error appears in the above-identified patent and that said Letters Patent is hereby corrected as shown below:

On athe ittle page, item [54] and in column 1, line 2, the title should read "METHOD OF PRODUCING COMPOSITES CAPABLE OF HARMONIC GENERATION"

Signed and Sealed this

Twentieth Day of September, 1994

Attest:

BRUCE LEHMAN

Attesting Officer

Commissioner of Patents and Trademarks